United States Patent

Abe et al.

[11] Patent Number: 5,223,746
[45] Date of Patent: Jun. 29, 1993

[54] PACKAGING STRUCTURE FOR A SOLID-STATE IMAGING DEVICE WITH SELECTIVELY ALUMINIUM COATED LEADS

[75] Inventors: Hironobu Abe; Masahiko Kadowaki, both of Mobara; Toshio Nakano, Chiba; Hideaki Abe, Mobara; Akiya Izumi, Mobara; Tunehisa Horiuchi, Mobara; Yoshinori Niwata, Mobara, all of Japan

[73] Assignees: Hitachi, Ltd., Tokyo; Hitachi Device Engineering Co., Ltd., Chiba, both of Japan

[21] Appl. No.: 847,269

[22] Filed: Mar. 10, 1992

Related U.S. Application Data

[63] Continuation of Ser. No. 538,100, Jun. 14, 1990, abandoned, which is a continuation-in-part of Ser. No. 494,458, Mar. 16, 1990, abandoned.

[30] Foreign Application Priority Data

Jun. 14, 1989 [JP] Japan .................. 1-149689

[51] Int. Cl.⁵ ............... H01L 23/02; H01L 23/12; H02B 1/00; H05K 7/02
[52] U.S. Cl. ................. 257/678; 257/680; 257/703; 257/666; 257/750; 257/765; 361/388; 361/389; 361/403; 361/417
[58] Field of Search .............. 357/74, 72, 75, 70, 357/71, 80, 73; 361/388, 389, 403, 417

[56] References Cited

U.S. PATENT DOCUMENTS

| | | | |
|---|---|---|---|
| 3,381,071 | 4/1968 | Logan et al. | 357/74 |
| 4,590,672 | 5/1986 | Shimizu et al. | 357/70 |
| 4,707,724 | 11/1987 | Suzuki et al. | 357/71 |
| 4,796,083 | 1/1989 | Cherukuri et al. | 357/74 |

Primary Examiner—William D. Larkins
Assistant Examiner—Carl Whitehead, Jr.
Attorney, Agent, or Firm—Antonelli, Terry, Stout & Kraus

[57] ABSTRACT

A packaging structure is provided which is especially useful for solid-state imaging devices and other semiconductor devices. An Al film is selectively formed on inner lead portions and portions of positioning reference plates located within a ceramic packaging body. On the other hand, the outer lead portions that are exposed outside the packaging body are coated with Sn plating layer. Particular care is taken not to locate the Sn plating layer over the Al film. Contamination faults due to Sn swelling and stripping are prevented, while bonding strength of the Al clad inner lead portions with Al internal fine wires and with fit glass joining the ceramic packaging body together is kept high.

36 Claims, 3 Drawing Sheets

BND (CLD)  ALY

UPP, CLD, IL, CLD, OL, REP2, HL2, SP, LF

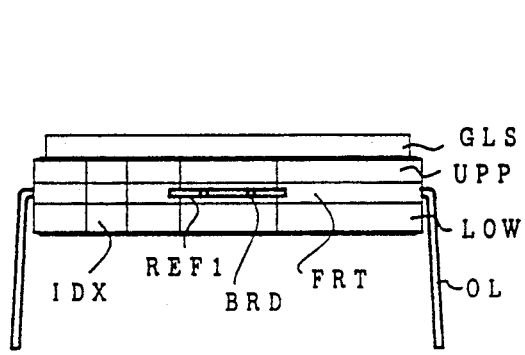
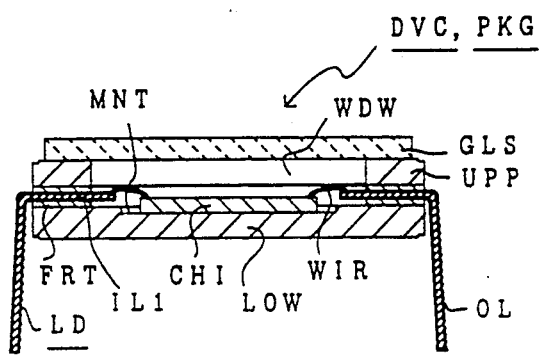
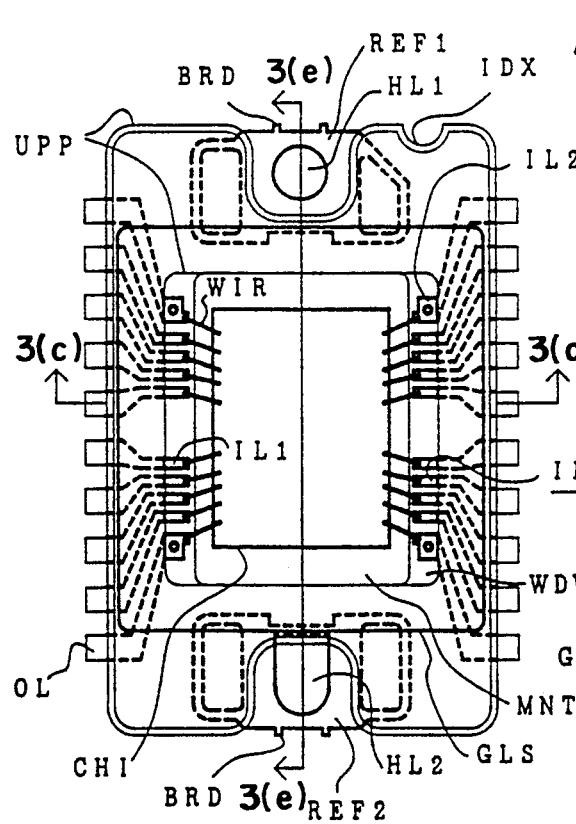
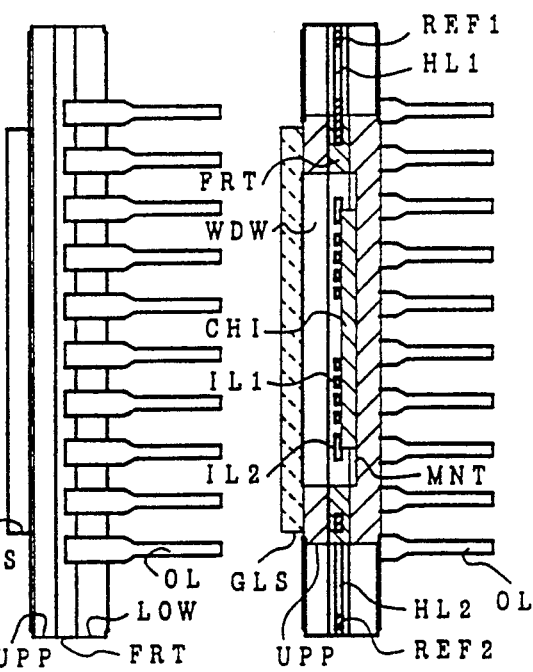

5,223,746

PACKAGING STRUCTURE FOR A SOLID-STATE IMAGING DEVICE WITH SELECTIVELY ALUMINIUM COATED LEADS

RELATED APPLICATION DATA

This is a continuation of Ser. No. 07/538100 filed Jun. 14, 1990, now abandoned, which is a continuation-in-part of Ser. No. 07/494458 filed Mar. 16, 1990 now abandoned. The disclosure of Ser. No. 07/494458 is hereby incorporated by reference.

BACKGROUND OF THE INVENTION

1. Field of the Invention

The present invention relates to a semiconductor device package with a semiconductor device encapsulated therein, and, more, particularly, to a solid-state imaging device.

2. Description of the Prior Arts

Packages for semiconductor integrated circuits can be classified by type of material into three types: plastic packages using resin molding technology; ceramic packages using printed circuit ceramic substrates; glass sealed packages in which leads are sandwiched by two ceramic bodies and the assembly is sealed with low-melting point frit glass. Packages in which leads are arranged in two parallel sides of a square are called dual-in-line (DIL) packages and are the most widespread type. Hence, the aforementioned three types are also called DILP, DILC, and DILG, respectively. The DILG is also called a "cerdip" type. The manufacturing cost of three packages is high in the ascending order of DILP, DILG, and DILC, whereas reliability including moisture resistance is high in the descending order of DILC, DILG, and DILP.

Though the most distributed type for solid-state imaging devices until recently has been the DILC package with high moisture resistance, the DILG type is preferable in view of cost. An example of the DILC package is described in Japanese Laid-Open Publication No. 54(1979)-146985, while an example of the DILG is described in Japanese Laid-Open Publication No. 59(1984)-161187.

The conventional packages of solid-state imaging devices are mainly and currently of the type of DILC, and therefore the detailed structures as well as composition materials are not clarified.

By the way, a fine wire of such material as Au or Al is used for electrical connection between a semiconductor chip and leads within the package, and it is known in the semiconductor field to coat the leads with Al film so as to obtain a high bonding strength between wires and leads.

The present inventors found that the Al clad film has the above advantage but also has a serious disadvantage, especially for solid-state imaging devices.

SUMMARY OF THE INVENTION

It is an object of the present invention to provide a solid-state imaging device capable for manufacturing with high yield.

It is another object of the present invention to provide a packaging structure for solid-state imaging devices with a high reliability.

It is another object of the present invention to provide a solid-state imaging device with low cost.

According to an embodiment of the present invention there is provided a packaging structure for a solid-state imaging device in which an Al film is selectively coated on inner leads, while other portions, exposed from the packaging body, of outer leads and positioning reference plates are free from the Al clad. The exposed portions are plated by Sn to prevent rust and to increase solderability. As a result, the fault of contamination due to Sn swelling or stripping is prevented because none of the Al film is located between the foundation materials and the Sn plating layer. At the same time the bonding strength between the inner leads and the wires coupling to the semiconductor chip kept high.

The present invention, the above and other objects, features and advantages of the present invention will become more apparent from the following detailed description in conjunction with the accompanying drawings.

BRIEF DESCRIPTION OF THE DRAWINGS

FIG. 3 is a view of a solid-state imaging device including drawings (a) to (e) as seen from various angles.

DETAILED DESCRIPTION OF THE PREFERRED EMBODIMENTS

Figure 1:
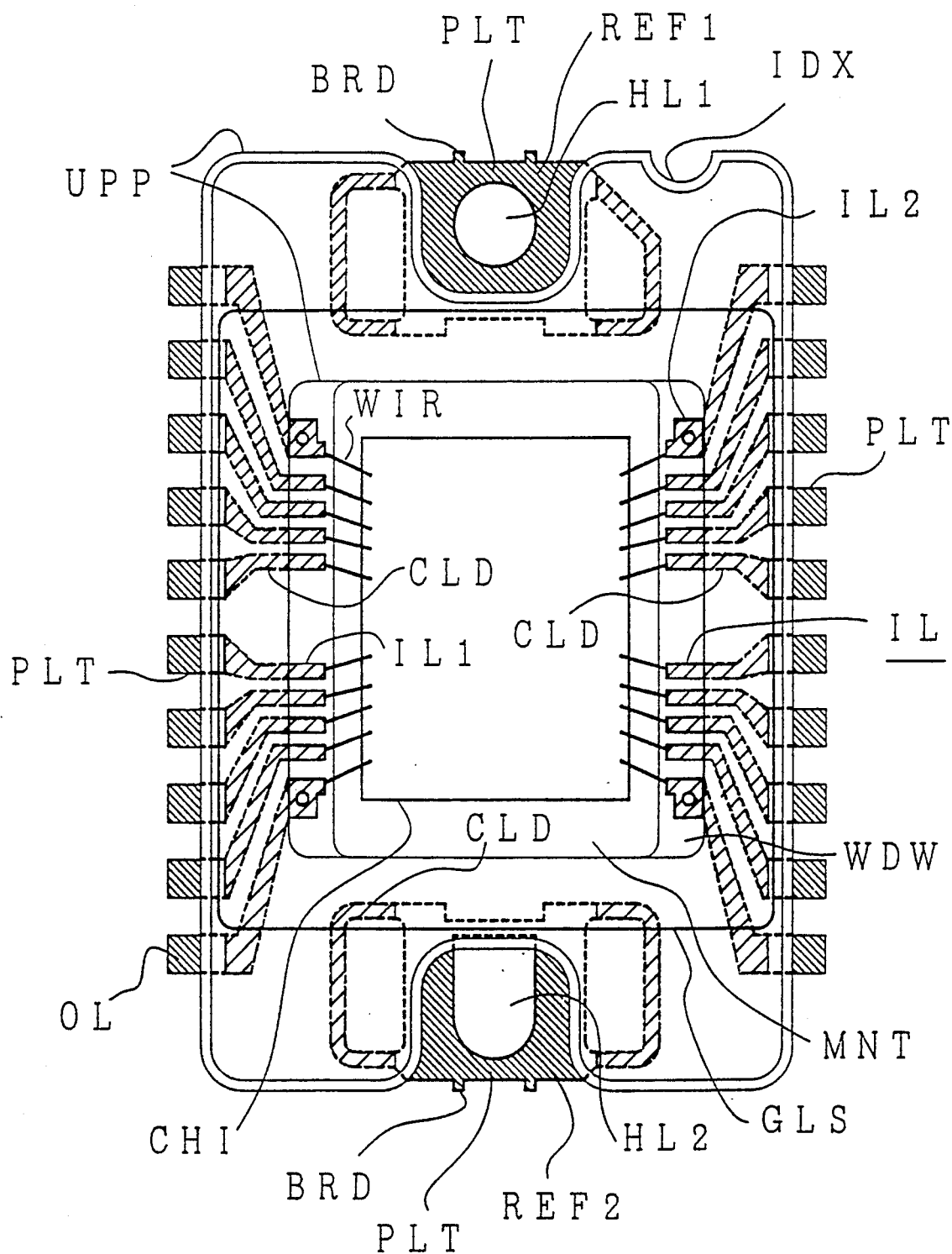
FIG. 1 is a top plane view illustrating an embodiment of the present invention from an identical side as a top plane view (a) of FIG. 3, but magnified and modified by hatching to put emphasis on certain features of the invention.

FIG. 3 illustrates an embodiment of a semiconductor package according to the present invention. There is shown a solid-state imaging device in which a solid-state imaging chip is packaged. Hereinafter, the overall structure will be referred to as a solid-state imaging device DVC, and a portion (container) of the solid-state imaging device DVC excluding the solid-state imaging chip CHI will be referred to as a package PKG.

In FIG. 3, (a) is a top plane view of the solid-state imaging device DVC as seen from the light-receiving surface side of the chip CHI. With the top plane view shown in (a) as a reference, (b) is a side elevational view as seen from the upper side; (c) is a cross-sectional view taken along the line c—c; (d) is a side elevational view as seen from the right-hand side; and (e) is a cross-sectional view taken along the line e—e.

Window glass GLS is a light-transmissive sealing plate and is formed of a glass material such as borosilicate glass ($B_2O_3 \cdot SiO_2$).

The solid-state imaging chip CHI is formed by monolithic semiconductor integrated circuit technology, and a plurality of photoelectric converters such as photodiodes are arrayed on its obverse surface (light-receiving surface) on the window glass GLS side, while its reverse surface is bonded to a lower ceramic substrate LOW by means of an adhesive such as a silver paste material.

The lower ceramic substrate LOW has a mount portion MNT which is a recessed portion for mounting the solid-state imaging chip CHI in its center, and the relationship of height between the solid-state imaging chip CHI and inner leads IL is adjusted by means of this recessed portion.

An upper ceramic frame UPP has a light-receiving window WDW formed by hollowing a central portion thereof, and the external light is adapted to be applied to the solid-state imaging chip CHI.

Leads LD are used to electrically connect the solid-state imaging chip CHI to an external application circuit (not shown) such as a printed circuit board, and is secured between the upper and lower ceramic members UPP, LOW by means of glass frit FRT. The leads LD include inner leads IL for connection to the solid-state imaging chip CHI and outer leads OL for connection to the external circuit. These two groups of lead portions are formed in such a manner as to be continuous (unitary) with each other. As for the inner leads IL, there are a total of 20 inner leads including 16 inner leads IL1 which are provided with distal ends having the same configuration and which are located on the inner side, as well as four inner leads IL2 which are provided with larger-size distal ends each having a round hole in its central portion and which are respectively located at the four corners. The special configuration of these inner leads IL2 is useful for recognition of the lead position and pattern at the time of automatic wire bonding.

A bonding wires WIR are metal wires formed of Al, Au, or the like and are used to connect the inner leads IL to bonding pads of the solid-state imaging chip CHI. Since position of the upper surface of the solid-state imaging chip CHI is lower than that of the upper surfaces of the inner leads IL thanks to the cavity of the mount portion MNT, it is possible to prevent in advance the occurrence of any fault resulting from a short-circuiting which takes place when the bonding wire WIR droops and contacts an edge of the solid-state imaging chip CHI.

Reference holes HL1 and HL2 are formed in metal plates REF1 and REF2, respectively. When the solid-state imaging chip CHI is automatically die-bonded to the mount portion MNT, its positioning is effected by using as references the reference holes HL1, HL2 and/or the holes of the inner leads IL2, so that the relative positions between the reference holes HL1, HL2 and the solid-state imaging chip CHI are set with good accuracy. Accordingly, when the solid-state imaging device DVC is mounted on an application product such as a VTR camera or the like, if the reference holes HL1, HL2 are used as the positioning references, the center of a lens of the application product and the center of a photodiode array of the solid-state imaging chip CHI can be aligned with each other with good accuracy. One reference hole HL1 is made in a circle and another hole HL2 is substantially rectangularly shaped. The reference hole HL1 is available for limiting or defining the position in horizontal and vertical (XY) directions, and the dual parallel straight sides of the reference hole HL2 are available for defining the position in a rotating ($\theta$) direction. It is possible to set the position by inserting pins through both of the reference holes.

Indented portions IDX are provided in the upper and lower ceramic members UPP and LOW and serve as indices for indicating the reference positions for the circuit layout of the 20 outer leads IL1.

FIG. 1 is a top plane view modifying the top plane view (a) of FIG. 3 to be magnified, for providing a better understanding of the state of selective metal coating for foundation materials of leads IL and OL and reference plates REF for reference holes.

Cross-hatched portions CLD (inner leads IL and portions of reference plates REF) denote regions being selectively coated with an aluminium film and limited within the ceramic body UPP not to extend out thereof. In other words, the foundation materials of regions PLT (outer leads OL and portions of reference plates REF) exposed out of the ceramic body UPP and denoted by 135° hatching, are plated by Sn without Al clad layer therebetween. The Sn plating is available to keep the foundation materials from rusting and to increase solderability of the outer leads OL when attached to application apparatus.

According to analyses by the present inventors, it is found that when Sn is plated on Al clad layer the Sn plating layer becomes swelled and hence easily stripped to cause contamination. The Sn contamination potentially adheres to chip CHI in the assembling steps just before the encapsulation by the window glass GLS, and furthermore to window glass GLS after the encapsulation as well as shipping. This can cause serious or fatal faults for imaging characteristics, and a significant decrease of yield and reliability. It is also found that the potential or possibility for faults is higher especially as to the reference plates REF for positioning, because the surface area thereof parallel to the image-pick-up plane is large.

The Al clad layer CLD is available for increasing the bonding strength among fine wires WIR and leads IL, and further is effective to increase the bonding strength with frit glass. Hence, it is preferably provided on as wide a surface as possible on the inner leads IL and reference plates REF without extending to the exposed regions PLT.

Figure 2A:
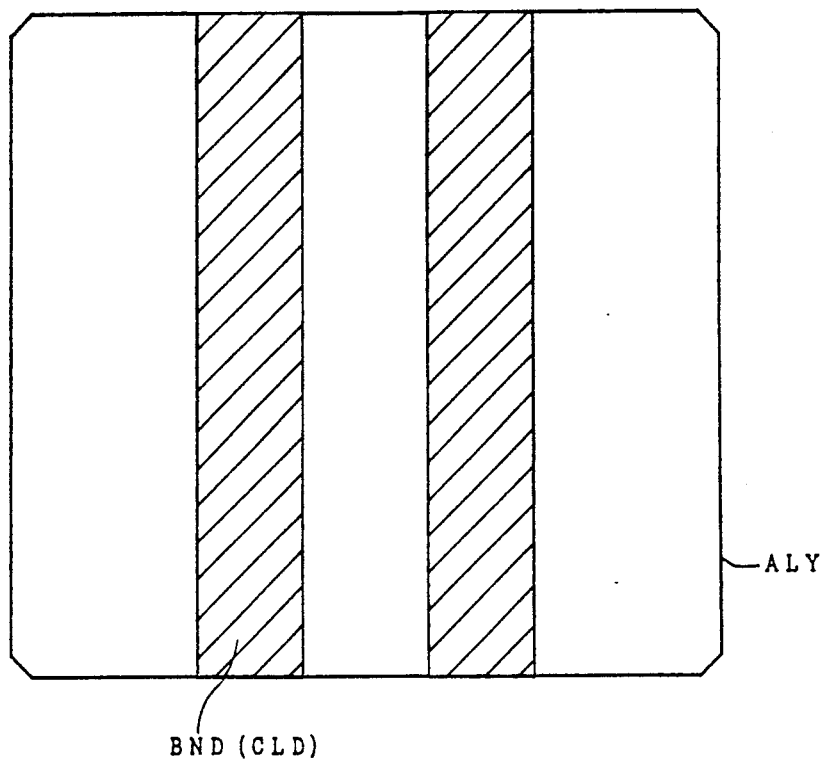
FIG. 2A and FIG. 2B are top plane views each illustrating a lead frame at the status just after Al rolling and after press working, respectively.
Figure 2B:
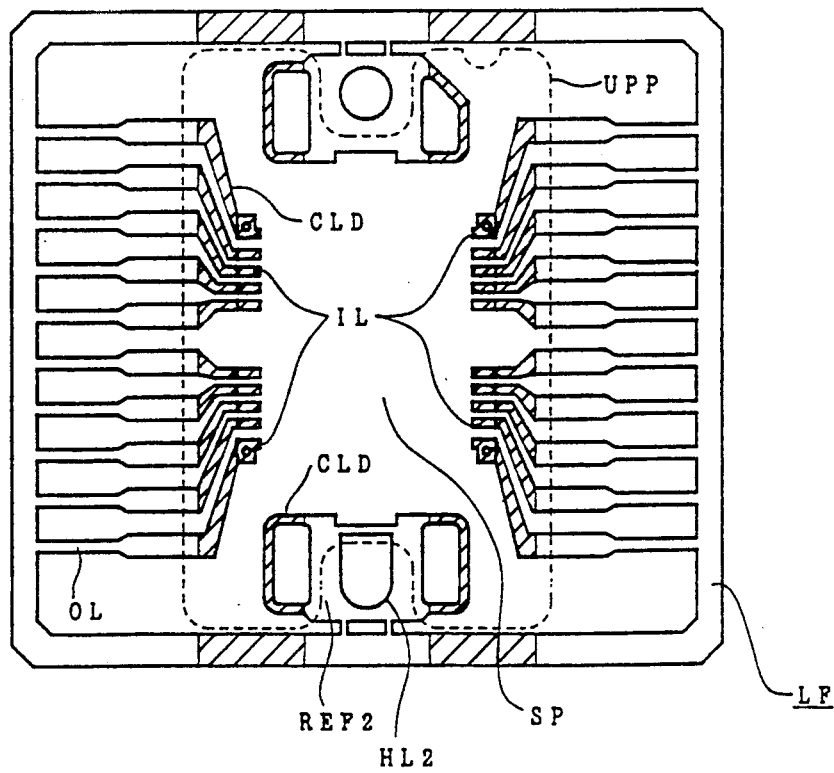

FIG. 2A and FIG. 2B are diagrams for explaining an example in which a lead frame LF with a selective Al clad layer CLD is formed by rolling and press working or processing. In FIG. 2A, ALY denotes metal plates, i.e., a material of the lead-frame. As the material, e.g., the so called 42 alloy, including 42% of Ni and 58% of Fe in weight is, can be selected. As a modification, it is also possible to select an alloy including Co in addition to Ni and Fe, though it appears slightly expensive. The Al clad film bands BND designated by cross-hatch are formed by positioning two aluminium stripes or ribbons on the foundation alloy material ALY and then rolling (extending with pressure) them.

Then, as shown in FIG. 2B, unnecessary portions of the metal plate ALY are removed by a press molding process to form a lead frame LF including, in one united body, leads IL and OL, reference plates REF for reference openings and the frame, etc. The method just described is the most economical method, though other methods, e.g., a combination of masking evaporation of aluminium and photolithography, are also possible. By the way, in conventional semiconductor integrated circuits, a member so called tab-lead or die-attach is formed in one united lead-frame at the region (corresponding to a portion denoted by reference SP in FIG. 2B) surrounded by tip portions of inner leads IL, however for such a case the selective Al formation by the aforementioned rolling method is difficult to use. On the contrary according to the present embodiment, since the chip CHI is attached on the recessed portion MNT of the lower ceramic substrate LOW, there exists none of the members necessitating aluminium clad film on the assumed center line between two reference plates REF1 and REF2, and hence it is possible to use the rolling method of stripe shaped aluminium as shown in FIG. 2A.

Next, the assembling method of the device DVC after the state shown in FIG. 2A will be briefly explained.

The lead frame in which the outer leads OL are bent substantially perpendicularly is placed on the low ceramic substrate LOW in which the glass frit FRT is applied to its raised portion around the mount portion MNT in the form of a frame, the upper ceramic frame UPP is superposed on the assembly, and these members are fused together with the glass frit FRT.

Sn plating is done with masking the opening WDW of the upper ceramic frame member UPP by proper materials. In this condition, since portions of lead-frame LF are contiguous with each other, Sn is selectively plated only at the exposed potions PLT of the metal foundation material from the upper and lower ceramic members.

The first cutting is done to remove unnecessary portions (bridge portions between the frame and reference metal plates REF1 and REF2) of the lead-frame LF. Projections BRD on the metal plates REF1, REF2 for reference holes are traces of removal of unnecessary bridge portions.

The solid-state imaging chip CHI is automatically die-bonded to the mount portion MNT, and the inner leads IL and the solid-state imaging chip CHI are automatically wire-bonded with the bonding wire WIR.

The window glass GLS is then adhered to the upper ceramic frame UPP by means of an organic adhesive or the like.

The second cutting is done to remove unnecessary portions of the lead frame LF to separate the 20 outer leads OL from each other.

What is claimed is:

1. A solid-state imaging device comprising:
   a solid-state imaging chip;
   a plurality of leads provided with inner lead portions for electrical connection with said chip;
   a reference plate; and
   a packaging body containing said chip, said inner lead portions and a first portion of said reference plate,
   wherein said reference plate includes a second portion and a hole which are both exposed out of said packaging body, wherein said hole is located to serve as a positioning reference for mounting of the solid-state imaging device,
   wherein said leads include outer lead portions exposed out of said packaging body for external connections, and
   wherein said inner lead portions are provided with aluminum clad, and wherein said second portion of said reference plate is free from said aluminum clad.

2. A solid-state imaging device according to claim 1, further comprising wirings comprised of aluminum being bonded between said inner lead portions and said chip.

3. A solid-state imaging device according to claim 2, wherein said outer lead portions and said second portion of said reference plate are covered with a coating including tin.

4. A solid-state imaging device according to claim 1, wherein said first portion of said reference plate is provided with said aluminum clad.

5. A package for a solid-state imaging device comprising:
   a ceramic substrate with a recessed portion at which a solid-state imaging chip is to be mounted;
   a ceramic frame with an opening to form a window;
   a plurality of leads with inner lead portions sandwiched by said ceramic substrate and said ceramic frame and outer lead portions extending out of said ceramic substrate and said ceramic frame; and
   a reference plate with a first portion sandwiched by said ceramic substrate and said ceramic frame and a second portion extending out of said ceramic substrate and said ceramic frame,
   wherein said inner lead portions are provided with aluminum clad, and wherein said second portion of said reference plate is free from said aluminum clad, and
   wherein said second portion of said reference plate includes an opening which is located to serve as a positioning reference for mounting the package for the solid-state imaging device.

6. A package for a solid-state imaging device according to claim 5, wherein said leads and said reference plate are secured to said ceramic substrate and said ceramic frame by frit glass.

7. A package for a solid-state imaging device according to claim 5, wherein said opening has a substantially circular shape.

8. A package for a solid-state imaging device according to claim 5, wherein said first portion of said reference plate is provided with said aluminum clad.

9. A package for a solid-state imaging device according to claim 6, wherein said first portion of said reference plate is secured by said frit glass and is covered with said aluminum clad to improve bonding with said frit glass.

10. A package comprising:
    a package body with a recessed portion at a substantially central portion thereof, a first pair of side surfaces facing each other and a second pair of side surfaces facing each other;
    a plurality of leads extending out of said body at said first pair of side surfaces, each having an inner lead portion with a clad layer comprised of aluminum and embedded within said body and an outer lead portion exposed and outwardly extended from said body; and
    a first and a second reference plate, each extending out of said body at one of said second pair and the other of said second pair of said side surfaces, respectively,
    wherein said first and second reference plates each include an embedded portion located within the package body and an exposed portion located outside of the package body, wherein the exposed portions of the first and second reference plates are both free of the clad layer, and wherein at least the first reference plate is provided with a hole which is located to serve as a positioning reference for mounting of the package.

11. A package according to claim 10, wherein each of said inner lead portions is provided with a tip portion inwardly extended and exposed from said body at said recessed portion.

12. A package according to claim 11, wherein said recessed portion includes therein a further recessed portion at which semiconductor chip is to be mounted.

13. A package according to claim 10, wherein said outer leads and the exposed portions of said reference plates are covered with tin coating.

14. A package according to claim 10, wherein said hole in said first reference plate is shaped substantially circularly, and wherein said second reference plate is provided with an opening having a different shape from that of said hole in said first reference plate, said opening being located to serve as an additional positioning reference for mounting the package.

15. A package according to claim 14, wherein said opening has a pair of substantially straight sides which are substantially perpendicular with each other.

16. A package according to claim 10, wherein said clad layer is provided along said first pair of sides at said inner lead portions to form a pair of strip regions, and wherein the region sandwiched by said pair of stripe regions is free from said clad layer and includes said exposed portions of said reference plates.

17. A package according to claim 16, wherein said pair of stripe regions includes said embedded portions of said reference plates so that the embedded portions are provided with said clad layer.

18. A package according to claim 16, wherein said reference plates and said leads are formed by forming over a metal plate a pair of separated strip films at said stripe regions to form said clad layer and thereafter removing unnecessary portions.

19. A package according to claim 10, wherein said embedded portions of said first and second reference plates are each at least partially covered with said clad layer.

20. A package according to claim 19, wherein said package body includes a pair of ceramic members joined together by a glass frit, and wherein said embedded portions of said reference plates covered with said clad layer are bonded to said glass frit.

21. A solid-state imaging device comprising:
a solid-state imaging chip;
a plurality of leads provided with inner lead portions for electrical connection with said chip;
a reference plate; and
a packaging body containing said chip, said inner lead portions and a first portion of said reference plate,
wherein said reference plate includes a second portion and a hole which are both exposed out of said packaging body, wherein said hole is located to serve as a positioning reference for mounting of the solid-state imaging device,
wherein said leads include outer lead portions exposed out of said packaging body for external connections, and
wherein said inner lead portions and the first portion of said reference plate located within the packaging body are covered with aluminum clad, wherein said second portion of the reference plate and the outer lead portions are free of the aluminum clad, and are covered with a coating including tin so that the aluminum clad and the coating including tin are separated from one another to avoid Sn contamination between the aluminum clad and the tin included in said coating.

22. A solid-state imaging device according to claim 21, further comprising wirings comprised of aluminum being bonded between said inner lead portions and said chip.

23. A package for a solid-state imaging device comprising:
a ceramic substrate with a recessed portion at which a solid-state imaging chip is to be mounted;
a ceramic frame with an opening to form a window;
a plurality of leads with inner lead portions sandwiched by said ceramic substrate and said ceramic frame and outer lead portions extending out of said ceramic substrate and said ceramic frame; and
a reference plate with a first portion sandwiched by said ceramic substrate and said ceramic frame and a second portion extending out of said ceramic substrate and said ceramic frame,
wherein said inner lead portions and the first portion of the reference plate are covered with aluminum clad, and wherein the outer lead portions and the second portion of the reference plate are free of the aluminum clad, and are covered with a coating including tin so that the aluminum clad and the coating including tin are separated from one another to avoid Sn contamination between the aluminum clad and the tin included in said coating, and
wherein said second portion of said reference plate includes an opening which is located to serve as a positioning reference for mounting the package for the solid-state imaging device.

24. A package for a solid-state imaging device according to claim 23, wherein said leads and said reference plate are secured to said ceramic substrate and said ceramic frame by frit glass.

25. A package for a solid-state imaging device according to claim 23, wherein said opening has a substantially circular shape.

26. A package for a solid-state imaging device according to claim 23, wherein said first portion of said reference plate is provided with said aluminum clad.

27. A package for a solid-state imaging device according to claim 24, wherein said first portion of said reference plate is secured by said frit glass.

28. A package comprising:
a package body with a recessed portion at a substantially central portion thereof, a first pair of side surfaces facing each other and a second pair of side surfaces facing each other;
a plurality of leads extending out of said body within said first pair of said side surfaces, each having an inner lead portion with a clad layer comprised of aluminum and embedded within said body and an outer lead portion exposed and outwardly extending from said body, wherein said outer lead portion is free of said aluminum clad layer and is covered with a coating including tin; and
a first and a second reference plate, each extending out of said body at one of said second pair and the other of said second pair of said side surfaces, respectively,
wherein said first and second reference plates each include an embedded portion located within the package body and an exposed portion located outside of the package body, wherein the exposed portions of the first and second reference plates are both free of the clad layer, and wherein at least the first reference plate is provided with a hole which is located to serve as a positioning reference for mounting of the package,
wherein said exposed portions of said first and second reference plates are both covered with a coating including tin; and
wherein said coatings including tin and said aluminum clad layers are separated from one another to avoid Sn contamination.

29. A package according to claim 28, wherein each of said inner lead portions is provided with a tip portion inwardly extended and exposed from said body at said recessed portion.

30. A package according to claim 29, wherein said recessed portion includes therein a further recessed portion at which semiconductor chip is to be mounted.

31. A package according to claim 28, wherein said hole in said first reference plate is shaped substantially circularly, and wherein said second reference plate is provided with an opening having a different shape from that of said hole in said first reference plate, said opening being located to serve as an additional positioning reference for mounting the package.

32. A package according to claim 31, wherein said opening has a pair of substantially straight sides which are substantially perpendicular with each other.

33. A package according to claim 28, wherein said clad layer is provided along said first pair of sides at said inner lead portions to form a pair of strip regions, and wherein the region sandwiched by said pair of strip regions is free from said clad layer and includes said exposed portions of said reference plates.

34. A package according to claim 33, wherein said pair of stripe regions includes said embedded portions of said reference plates so that the embedded portions are provided with said clad layer.

35. A package according to claim 33, wherein said reference plates and said leads are formed by forming over a metal plate a pair of separated strip films at said stripe regions to form said clad layer and thereafter removing unnecessary portions.

36. A package according to claim 28, wherein said package body includes a pair of ceramic members joined together by a glass frit, and wherein said embedded portions of said reference plates covered with said clad layer are bonded to said glass frit.

* * * * *